(12) United States Patent
Geng et al.

(10) Patent No.: US 11,996,838 B2
(45) Date of Patent: May 28, 2024

(54) DRIVING DEVICE AND DRIVING METHOD

(71) Applicant: AUO Corporation, Hsin-Chu (TW)

(72) Inventors: Chi-Yu Geng, Hsin-Chu (TW);
Ming-Hung Tu, Hsin-Chu (TW);
Ya-Fang Chen, Hsin-Chu (TW);
Chih-Hsiang Yang, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 0 days.

(21) Appl. No.: 17/862,776

(22) Filed: Jul. 12, 2022

(65) Prior Publication Data

US 2023/0155586 A1    May 18, 2023

(30) Foreign Application Priority Data

Nov. 18, 2021  (TW) ................. 110143052

(51) Int. Cl.
*H03K 17/687*   (2006.01)
*G09G 3/32*   (2016.01)

(52) U.S. Cl.
CPC ........... *H03K 17/6872* (2013.01); *G09G 3/32* (2013.01)

(58) Field of Classification Search
CPC ........ H03K 17/6872; G09G 3/20; G09G 3/32; H03F 3/45076
See application file for complete search history.

(56) References Cited

U.S. PATENT DOCUMENTS

| | | | |
|---|---|---|---|
| 8,643,582 B2 * | 2/2014 | Tu | G09G 3/36 |
| | | | 345/98 |
| 2006/0277339 A1 | 12/2006 | Sakaki et al. | |
| 2016/0079976 A1 | 3/2016 | Saeki et al. | |
| 2021/0049956 A1 | 2/2021 | Yeh et al. | |

FOREIGN PATENT DOCUMENTS

| | | |
|---|---|---|
| CN | 104300928 A | 1/2015 |
| CN | 105427779 A | 3/2016 |

* cited by examiner

*Primary Examiner* — Ryan Johnson
*Assistant Examiner* — Colleen J O Toole
(74) *Attorney, Agent, or Firm* — WPAT, P.C

(57) ABSTRACT

A driving device comprises a first complementary metal-oxygen-semiconductor circuit and a first comparator. The first complementary metal-oxygen-semiconductor circuit is configured for outputting a power signal or a pull-down signal according to the first input signal. The first comparator comprises a first non-inverting input terminal and a first inverting input terminal. The first non-inverting input terminal is coupled to the first complementary metal-oxygen-semiconductor circuit, and is configured to receive the power signal or the pull-down signal. The first inverting input terminal is configured for receiving a first reference signal, and the first comparator is configured to compare one of the power signal and the pull-down signal and the first reference signal to provide a first driving signal.

19 Claims, 7 Drawing Sheets

DRIVING DEVICE AND DRIVING METHOD

CROSS-REFERENCE TO RELATED APPLICATION

This application claims priority to Taiwan Application Serial Number 110143052, filed Nov. 18, 2021, which is herein incorporated by reference in its entirety.

BACKGROUND

Field of Invention

The present disclosure relates to a display device and a display method. More particularly, the present disclosure relates to a driving device and a driving method applied to a light-emitting diode display.

Description of Related Art

At present, the signal transmission of LED driver IC mostly uses the single-ended signal or the differential signal, but the transmission speed of the single-ended signal is limited. However, in order to use the differential signal transmission, the number of signal lines needs to be doubled.

SUMMARY

The present disclosure provides a driving device. The driving device comprises a first complementary metal-oxygen-semiconductor circuit and a first comparator. The first complementary metal-oxygen-semiconductor circuit is configured to output a power signal or a pull-down signal according to a first input signal. The first comparator comprises a first non-inverting input terminal and a first inverting input terminal. The first non-inverting input terminal is coupled to the first complementary metal-oxygen-semiconductor circuit, and is configured to receive the power signal or the pull-down signal. The first inverting input terminal is configured to receive a first reference signal, wherein the first comparator is configured to compare one of the power signal and the pull-down signal and the first reference signal to provide a first driving signal.

The present disclosure provides a driving method. The driving method comprises: outputting a power signal or a pull-down signal according to a first input signal by a first complementary metal-oxygen-semiconductor circuit; receiving the power signal or the pull-down signal by a first non-inverting input terminal of a first comparator; receiving a first reference signal by a first inverting input terminal of the first comparator; and comparing one of the power signal and the pull-down signal and the first reference signal to provide a first driving signal by the first comparator.

Therefore, according to the technical content of the present disclosure, the driving device and the driving method of the present disclosure can be applied to a light-emitting diode display with high display quality. In addition, the use of the driving device and the driving method of the present disclosure improve the signal transmission speed without doubling the number of signal lines, so the problem of affecting the display signal transmission speed can be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
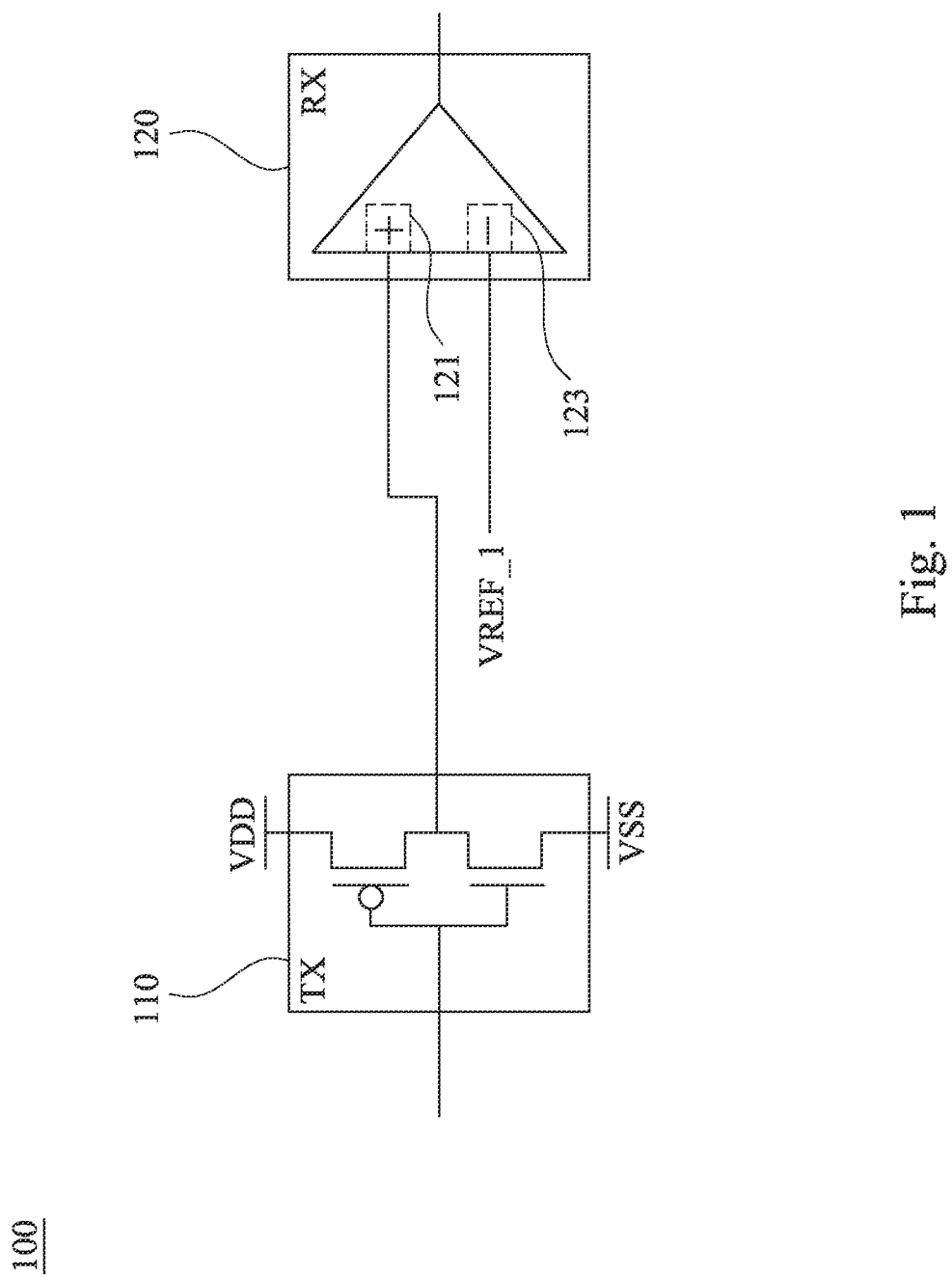
FIG. 1 is a schematic diagram of a driving device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram of a driving device according to one embodiment of the present disclosure. As shown in the figure, the driving device 100 includes a first complementary metal-oxygen-semiconductor circuit 110 and a first comparator 120. The first comparator 120 includes a first non-inverting input terminal 121 and a first inverting input terminal 123. In connection relationship, the first non-inverting input terminal 121 is coupled to the first complementary metal-oxygen-semiconductor circuit 110.

In order to provide a driving device technology that increases the signal transmission speed without doubling the number of signal lines, the present disclosure provides the driving device 100 as shown in FIG. 1, and the related operations are described in detail as below.

In one embodiment, the first complementary metal-oxygen-semiconductor circuit 110 is configured to output a power signal VDD or a pull-down signal VSS according to a first input signal.

Then, the first non-inverting input terminal 121 is configured to receive the power signal VDD or the pull-down signal VSS. Subsequently, the first inverting input terminal 123 is configured to receive a first reference signal VREF_1.

Next, the first comparator 120 is configured to compare one of the power signal VDD and the pull-down signal VSS and the first reference signal VREF_1 to provide a first driving signal. For example, the first comparator 120 can receive the differential signal and the single-ended signal, but the present disclosure is not limited to this embodiment.

Figure 2:
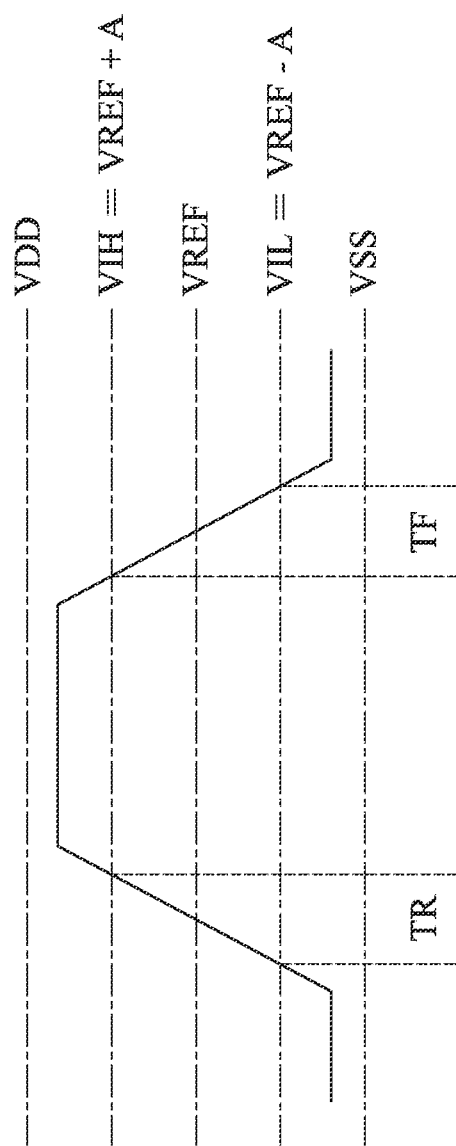
FIG. 2 is a schematic diagram of a waveform of a driving signal level according to one embodiment of the present disclosure.

FIG. 2 is a schematic diagram of a waveform of a driving signal level according to one embodiment of the present disclosure. Please refer to FIG. 1 and FIG. 2 together, in one embodiment, a reference voltage value VREF of the first reference signal VREF_1 is between the power signal VDD and the pull-down signal VSS. For example, the reference voltage value VREF of the first reference signal VREF_1 can be W×(VDD−VSS), and W is less than 1. For example, W can be 0.4~0.6, but the present disclosure is not limited to this embodiment.

In one embodiment, the driving voltage value of the first driving signal is between a high threshold VIH and the power signal VDD, wherein the high threshold includes a sum of the first reference signal and a parameter A, and the parameter A is a positive number greater than 0. For example, the first reference signal VREF_1 can be a reference signal VREF, the driving voltage value of the first driving signal can be a high-level voltage, and the high threshold VIH can be VREF+A (e.g., the reference signal VREF+a parameter A), and the parameter A is a positive number greater than 0. When the driving voltage value of the first driving signal is between the high threshold VIH and the power signal VDD, the first driving signal is the high-level voltage.

In one embodiment, the driving voltage value of the first driving signal is between a low threshold VIL and the pull-down signal VSS, wherein the low threshold includes a difference between the first reference signal and the parameter A, and the parameter A is a positive number greater than 0. For example, the first reference signal VREF_1 can be the reference signal VREF, the driving voltage value of the first driving signal can be a low-level voltage, and the low threshold VIL can be VREF−A (e.g., the reference signal VREF− the parameter A), and the parameter A is a positive number greater than 0. When the driving voltage value of the first driving signal is between the low threshold VIL and the pull-down signal VSS, the first driving signal is the low-level voltage.

In one embodiment, a difference between the high-level voltage and the low-level voltage is a swing value, and the swing value is related to the signal transmission speed. For example, if the high-level voltage is VREF_1+A+1 and the low-level voltage is VREF_1−A−1, the swing value is (VREF_1+A+1)−(VREF_1−A−1)=2A+2, and the swing value is bigger than 2A. When the swing value decreases, the rise time (TR) and the fall time (TF) can be shortened, thereby increasing the signal transmission speed.

Figure 3:
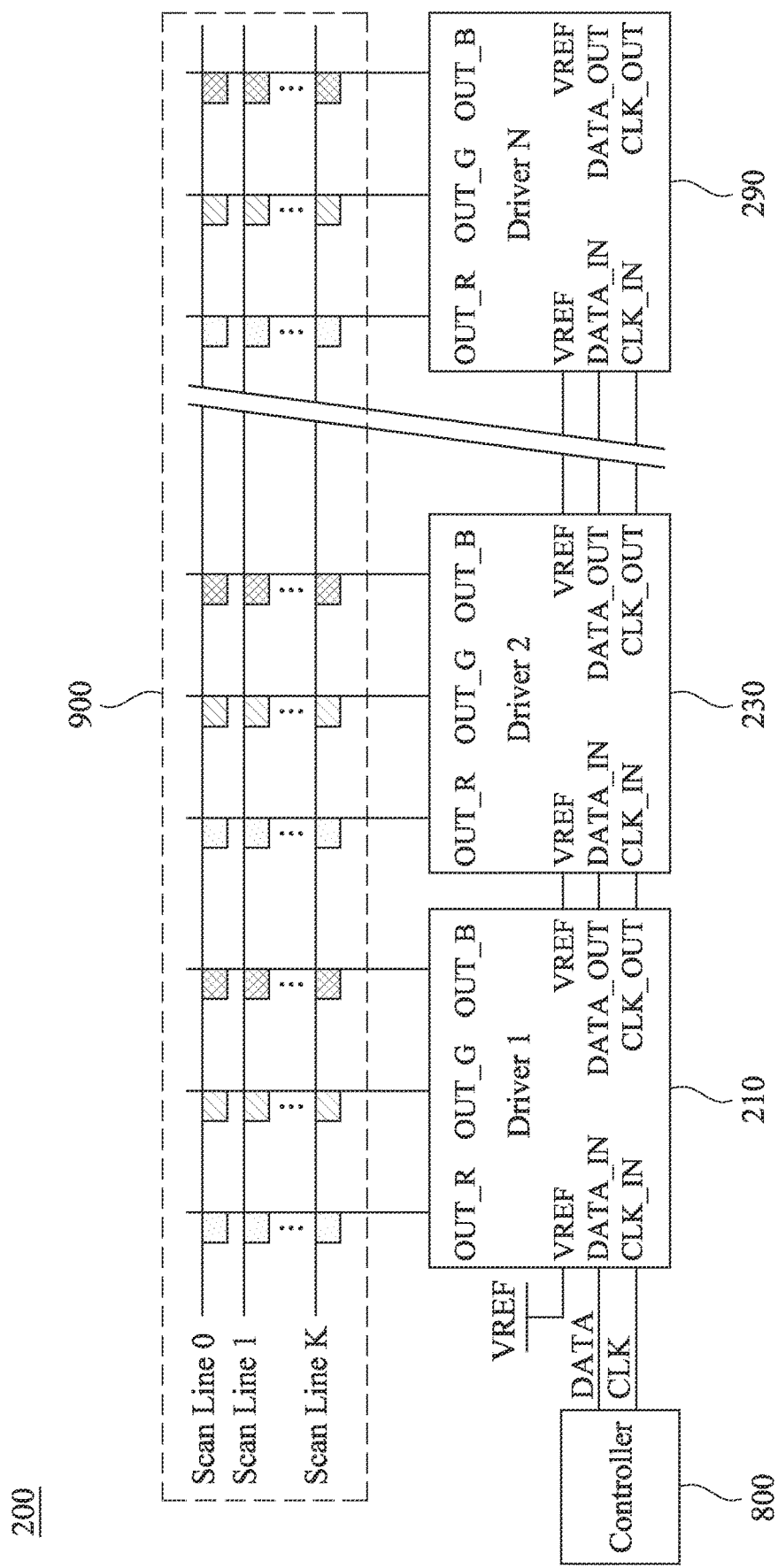
FIG. 3 is a schematic diagram of a display system according to one embodiment of the present disclosure.
Figure 4:
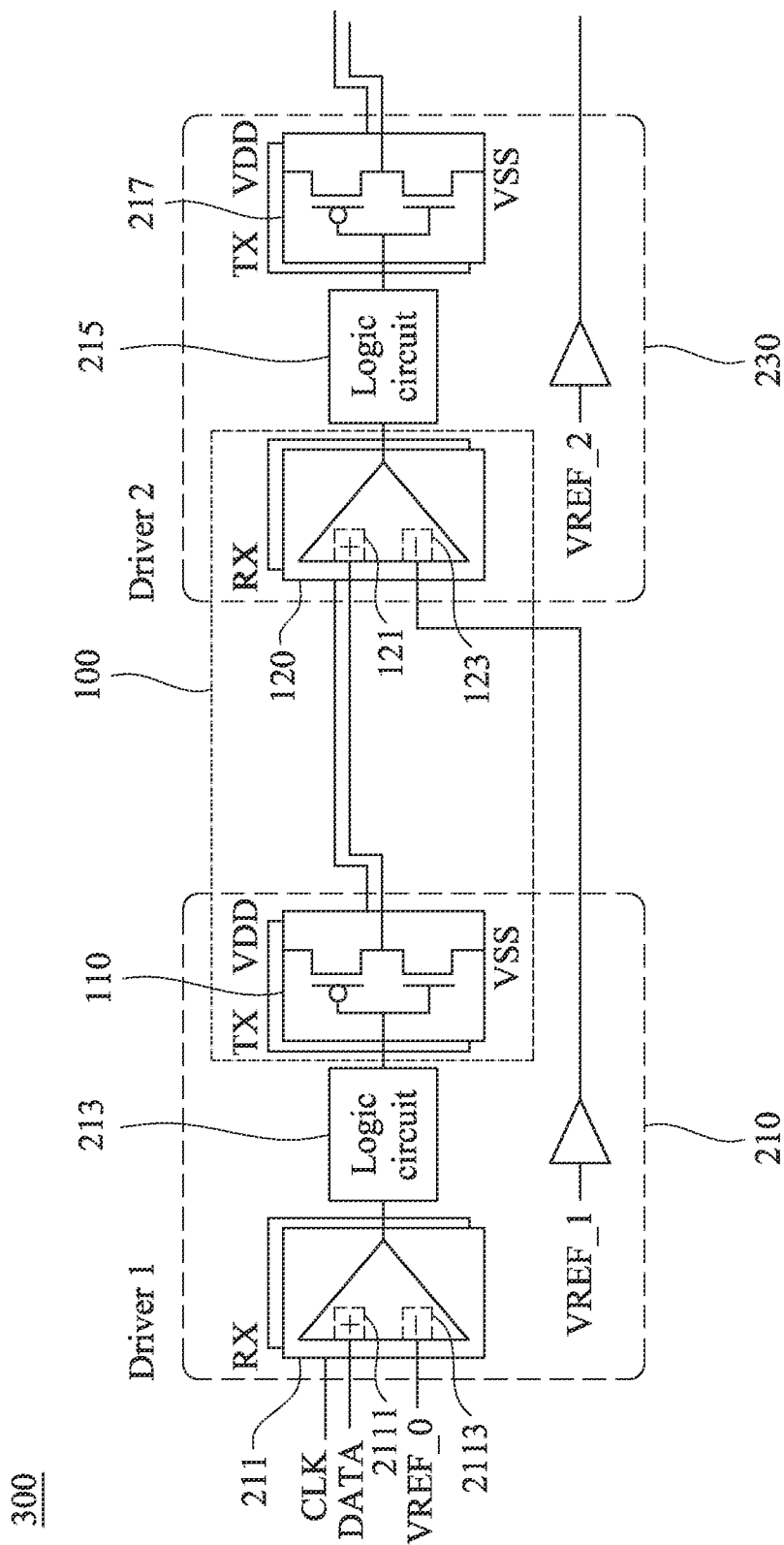
FIG. 4 is a detailed circuit diagram of a driving device according to one embodiment of the present disclosure.

FIG. 3 is a schematic diagram of a display system according to one embodiment of the present disclosure. FIG. 4 is a detailed circuit diagram of a driving device according to one embodiment of the present disclosure.

Please refer to FIG. 3, the display system 200 includes a first driver 210, a second driver, a Nth driver 290, a controller 800, and a panel 900. In connection relationship, the first driver 210 is coupled to the controller 800, the second driver 230 is coupled to the first driver 210, and the panel 900 is coupled to the first driver 210, the second driver 230, and the Nth driver 290.

In operation, in one embodiment, the first driver 210 receives the data signal DATA, the timing sequence signal CL, and the reference signal VREF. For example, the reference signal VREF can be the first reference signal VREF_1, the data signal DATA can be data signal DATA_IN, and the timing sequence signal CLK can be timing sequence signal CLK_IN.

Then, the first driver 210 transmits the data signal DATA, the timing sequence signal CLK, and the reference signal VREF to the second driver 230. For example, the data signal DATA can be data signal DATA_OUT, the timing sequence signal CLK can be the timing sequence signal CLK_OUT, and the reference signal VREF can be first reference signal VREF_1.

Subsequently, the first driver 210 combines the above-mentioned data signal DATA, the timing sequence signal CLK, and the reference signal VREF to form the image data, and the image data is converted into the driving signals to be coupled to the pixels in the panel 900. For example, the driving signals can be the signals OUT_R, OUT_G, OUT_B, etc. which are coupled to the pixels in the panel 900.

Next, the operation mode of the second driver 230 is similar to that of the first driver 210, so it is not repeated here.

Please refer to FIG. 1, FIG. 3, and FIG. 4, in one embodiment, the driving device 300 of FIG. 4 further includes a beginning comparator 211 and a first logic circuit 213 compared to the driving device 100 of FIG. 1, and the beginning comparator 211 includes a beginning non-inverting input terminal 2111 and a beginning inverting input terminal 2113. In connection relationship, the first logic circuit 213 is coupled to the beginning comparator 211, and the first logic circuit 213 is coupled to the first complementary metal-oxygen-semiconductor circuit 110.

In one embodiment, in operation, the beginning non-inverting input terminal 2111 is configured to receive the beginning signal.

Then, the beginning inverting input terminal 2113 is configured to receive the beginning reference signal VREF_0.

Subsequently, the first logic circuit 213 is configured to receive the beginning driving signal and provide the first input signal according to the beginning driving signal.

Please refer to FIG. 4, in one embodiment, the driving device 300 of FIG. 4 further includes a second logic circuit 215 and a second complementary metal-oxygen-semiconductor circuit 217 compared to the driving device 100 of FIG. 1. In connection relationship, the second logic circuit 215 is coupled to the first comparator 120, and the second complementary metal-oxygen-semiconductor circuit 217 is coupled to the second logic circuit 215.

In one embodiment, in operation, the second logic circuit 215 is configured to receive the first driving signal and provide the second input signal according to the first driving signal.

Then, the second complementary metal-oxygen-semiconductor circuit 217 is configured to provide the power signal VDD or the pull-down signal VSS according to the second input signal.

In one embodiment, the driving device 300 of FIG. 4 includes the beginning comparator 211, the first logic circuit 213, the first complementary metal-oxygen-semiconductor circuit 110, the first comparator 120, the second logic circuit 215, and the second complementary metal-oxygen-semiconductor circuit 217. The connection relationship and the operation are similar to those described in FIG. 4 above, and thus are not repeated here.

In one embodiment, each of the beginning comparator 211, the first logic circuit 213, the first complementary metal-oxygen-semiconductor circuit 110, the first comparator 120, the second logic circuit 215, and the second complementary metal-oxygen-semiconductor circuit 217 of the driving device 300 in FIG. 4 is plural. For example, the number of the plural of the elements as mentioned above can be 2 or 3, but the present disclosure is not limited to this embodiment.

In one embodiment, the beginning signal includes at least one of the data signal DATA and the timing sequence signal CLK.

In one embodiment, the beginning comparator 211 continues to receive the beginning reference signal VREF_0, the first comparator 120 continues to receive the first reference signal VREF_1, the beginning reference signal VREF_0 includes the reference voltage value VREF, and the first reference signal VREF_1 includes the reference voltage value VREF. For example, the beginning comparator 211 continues to receive the reference voltage value VREF, and the first comparator 120 continues to receive the reference voltage value VREF.

Figure 5:
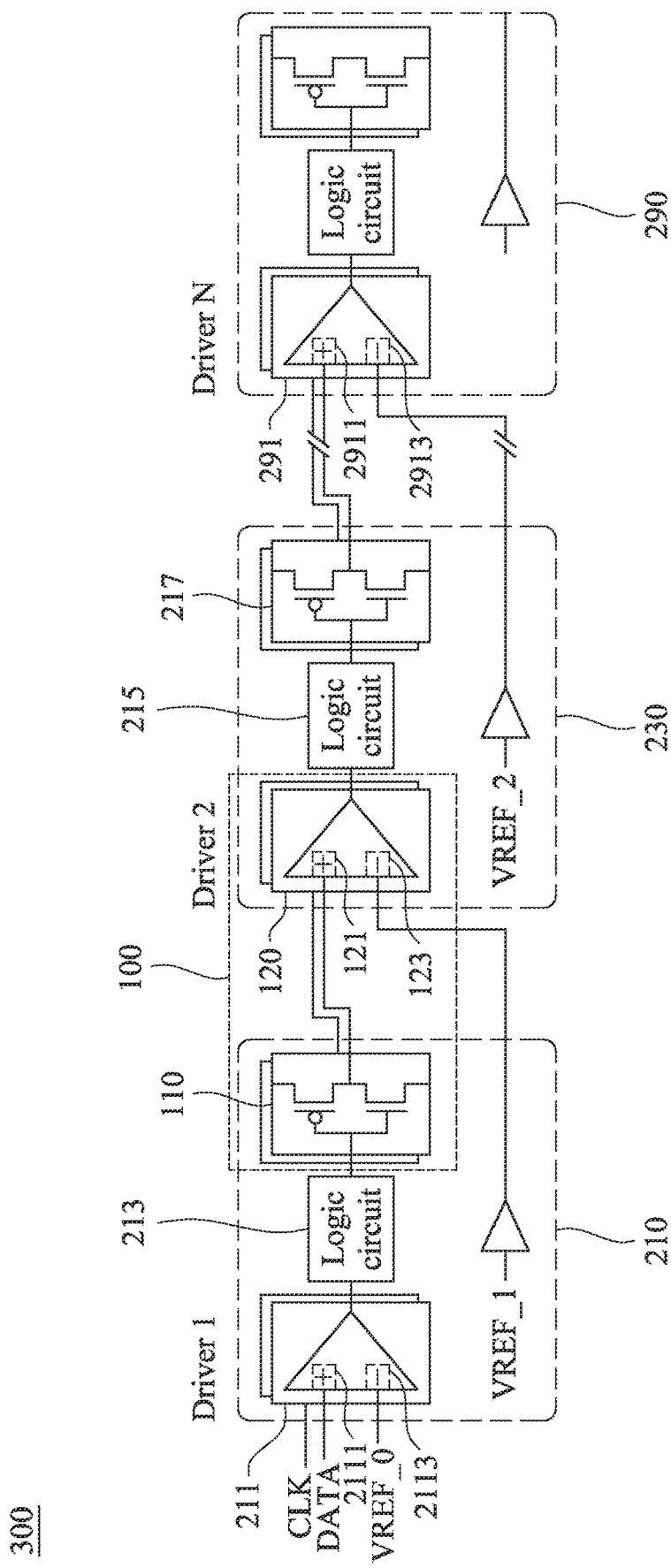
FIG. 5 is a detailed circuit diagram of a driving device according to one embodiment of the present disclosure.

FIG. 5 is a detailed circuit diagram of the driving device according to one embodiment of the present disclosure. Please refer to FIG. 4 and FIG. 5, the driving device 300 of FIG. 5 further includes a Nth comparator 291 compared to the driving device 300 of FIG. 4, the Nth comparator 291 includes a Nth non-inverting input terminal 2911 and a Nth inverting input terminal 2913, and N is a positive integer greater than 1. In addition, the connection relationship and the operation of the Nth comparator 291 are similar to those of the first comparator 120, and thus will not be repeated here.

In one embodiment, each of the beginning comparator 211, the first logic circuit 213, the first complementary metal-oxygen-semiconductor circuit 110, the first comparator 120, the second logic circuit 215, the second complementary metal-oxygen-semiconductor circuit 217, and the Nth comparator 291 of the driving device 300 in FIG. 5 is plural. For example, the number of the plural of the elements as mentioned above can be 2 or 3, but the present disclosure is not limited to this embodiment.

Figure 6:
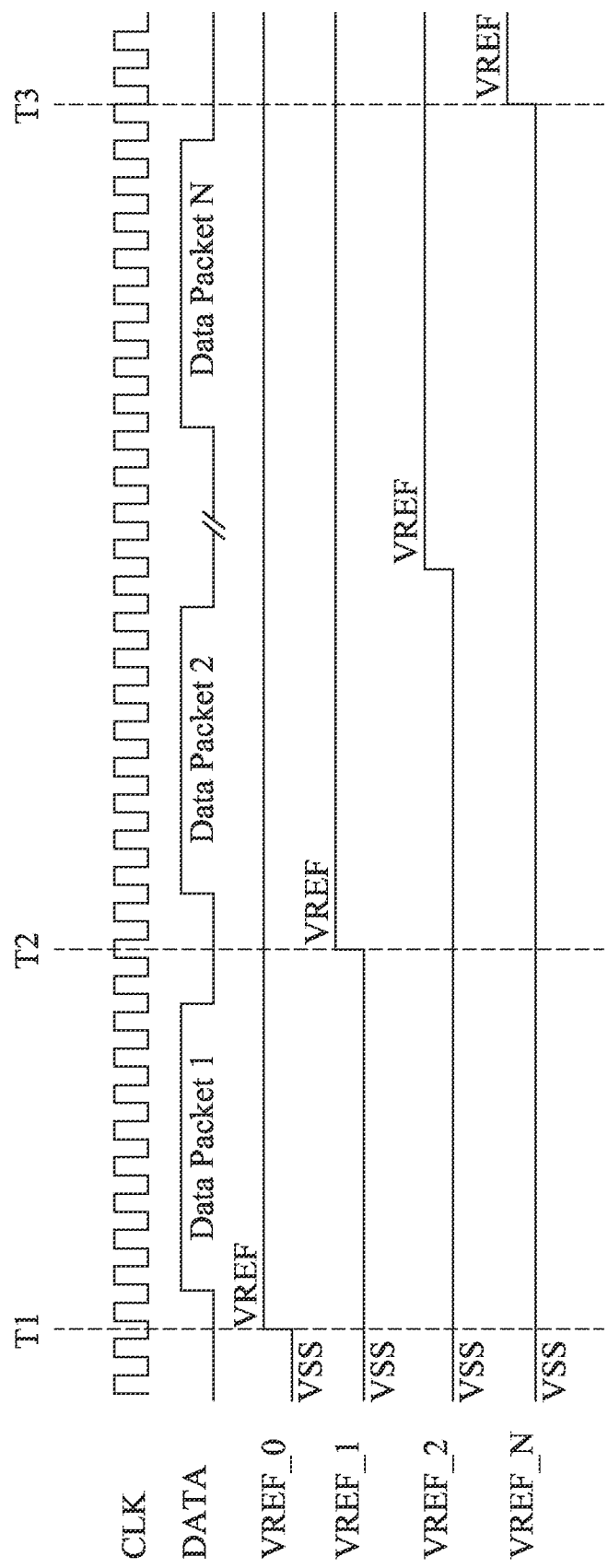
FIG. 6 is a schematic diagram of waveforms of a plurality of control signal levels according to one embodiment of the present disclosure.

FIG. 6 is a schematic diagram of waveforms of a plurality of control signal levels according to one embodiment of the present disclosure. Please refer to FIG. 5 and FIG. 6, in one embodiment, at the first moment T1, the beginning inverting input terminal 2113 receives the beginning reference signal VREF_0. For example, before the first moment T1, the beginning inverting input terminal 2113 receives the pull-down signal VSS, and at the first moment T1, the beginning inverting input terminal 2113 receives the beginning reference signal VREF_0. In addition, the pull-down signal VSS can be grounded, that means there is no signal.

In one embodiment, at the second moment T2, the first inverting input terminal 123 receives the first reference signal VREF_1. For example, before the second moment T2, the first inverting input terminal 123 receives the pull-down signal VSS, and at the second moment T2, the first inverting input terminal 123 receives the first reference signal VREF_1. In addition, the pull-down signal VSS can be grounded, that means there is no signal.

In one embodiment, at the third moment T3, the second inverting input terminal (for example: the inverting input terminal 2913) receives the second reference signal VREF_2. For example, before the third moment T3, the second inverting input terminal (for example: the inverting input terminal 2913) receives the pull-down signal VSS, and at the third moment T3, the second inverting input terminal (for example: the inverting input terminal 2913) receives the second reference signal VREF_2. In addition, the pull-down signal VSS can be grounded, that means there is no signal.

Figure 7:
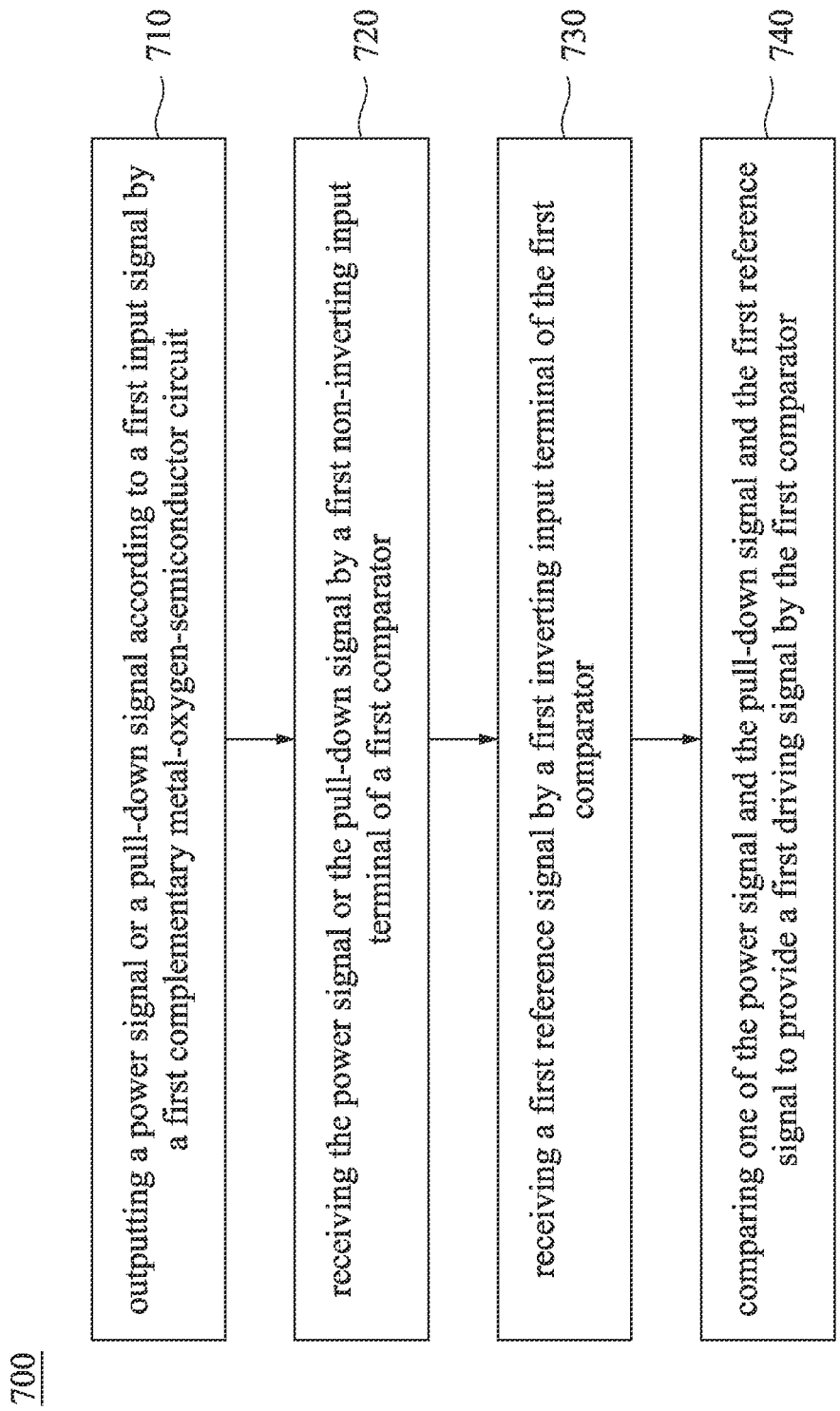
FIG. 7 shows a flowchart of a driving method according to an alternative implementation of the present disclosure.

FIG. 7 shows a flowchart of a driving method according to an alternative implementation of the present disclosure. In order to make the driving method 700 of FIG. 7 easier to understand, please refer to FIGS. 1 and 7 together. The driving method 700 of FIG. 7 includes the following steps:

Step 710: outputting a power signal or a pull-down signal according to a first input signal by a first complementary metal-oxygen-semiconductor circuit 110;

Step 720: receiving the power signal or the pull-down signal by a first non-inverting input terminal 121 of a first comparator 120;

Step 730: receiving a first reference signal by a first inverting input terminal 123 of the first comparator 120;

Step 740: comparing one of the power signal and the pull-down signal and the first reference signal to provide a first driving signal by the first comparator 120.

It can be seen from the above embodiments of the present disclosure that the application of the present disclosure has the following advantages. The driving device and the driving method shown in the embodiment of the present disclosure can be applied to a light-emitting diode display with high display quality. In addition, the use of the driving device of the present disclosure improves the signal transmission speed without doubling the number of signal lines, so the problem of the display signal transmission speed can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A driving device, comprising:
    a first complementary metal-oxygen-semiconductor circuit, configured to output a power signal or a pull-down signal according to a first input signal; and
    a first comparator, comprising:
        a first non-inverting input terminal, coupled to the first complementary metal-oxygen-semiconductor circuit, and configured to receive the power signal or the pull-down signal; and
        a first inverting input terminal, configured to receive a first reference signal, wherein the first comparator is configured to compare one of the power signal and the pull-down signal and the first reference signal to provide a first driving signal;
        wherein a driving voltage value of the first driving signal is between a high threshold and the power signal, or the driving voltage value is between a low threshold and the pull-down signal;
        wherein the high threshold comprises a sum of the first reference signal and a parameter, the low threshold comprises a difference between the first reference signal and the parameter.

2. The driving device of claim 1, wherein a reference voltage value of the first reference signal is between the power signal and the pull-down signal.

3. The driving device of claim 1, wherein the driving device further comprises:
    a beginning comparator, comprising:
        a beginning non-inverting input terminal, configured to receive a beginning signal;
        a beginning inverting input terminal, configured to receive a beginning reference signal, wherein the beginning comparator is configured to compare the beginning signal and the beginning reference signal to provide a beginning driving signal; and
    a first logic circuit, coupled to the beginning comparator, and configured to receive the beginning driving signal to provide the first input signal according to the beginning driving signal.

4. The driving device of claim 3, wherein the driving device further comprising:

a second logic circuit, coupled to the first comparator, and configured to receive the first driving signal to provide a second input signal according to the first driving signal;

a second complementary metal-oxygen-semiconductor circuit, configured to output the power signal or the pull-down signal according to the second input signal.

5. The driving device of claim 4, wherein the beginning signal comprises at least one of a data signal and a timing sequence signal.

6. The driving device of claim 5, wherein the driving device further comprises:
a Nth comparator, comprising:
a Nth non-inverting input terminal, coupled to a N−1th complementary metal-oxygen-semiconductor circuit, and configured to receive the power signal or the pull-down signal; and
a Nth inverting input terminal, configured to receive a Nth reference signal, wherein the Nth comparator is configured to one of the power signal and the pull-down signal and the Nth reference signal to provide a Nth driving signal, wherein N is a positive integer greater than 1.

7. The driving device of claim 6, wherein at a first moment, the beginning inverting input terminal receives the beginning reference signal.

8. The driving device of claim 7, wherein at a second moment, the first inverting input terminal receives the first reference signal.

9. The driving device of claim 8, wherein at a third moment, a second inverting input terminal receives a second reference signal.

10. The driving device of claim 1, wherein the driving voltage value of the first driving signal comprises one of a high-level voltage and a low-level voltage.

11. The driving device of claim 10, wherein a difference between the high-level voltage and the low-level voltage is a swing value.

12. The driving device of claim 11, wherein the swing value is related to a signal transmission speed.

13. The driving device of claim 1, wherein the driving device further comprises:
a beginning comparator, comprising:
a beginning non-inverting input terminal, configured to receive a beginning signal.

14. The driving device of claim 13, wherein the beginning comparator further comprises:
a beginning inverting input terminal, configured to receive a beginning reference signal.

15. The driving device of claim 14, wherein the beginning comparator is configured to compare the beginning signal and the beginning reference signal to provide a beginning driving signal.

16. The driving device of claim 15, wherein the beginning comparator further comprising:
a first logic circuit, coupled to the beginning comparator, and configured to receive the beginning driving signal to provide the first input signal according to the beginning driving signal.

17. The driving device of claim 16, wherein the beginning signal comprises at least one of a data signal and a timing sequence signal.

18. The driving device of claim 1, wherein the driving device further comprises:
a second logic circuit, coupled to the first comparator, and configured to receive the first driving signal to provide a second input signal according to the first driving signal.

19. A driving method, comprising:
outputting a power signal or a pull-down signal according to a first input signal by a first complementary metal-oxygen-semiconductor circuit;
receiving the power signal or the pull-down signal by a first non-inverting input terminal of a first comparator;
receiving a first reference signal by a first inverting input terminal of the first comparator; and
comparing one of the power signal and the pull-down signal and the first reference signal to provide a first driving signal by the first comparator;
wherein the first reference signal comprises a parameter value multiplying a difference between the power signal and the pull-down signal;
wherein the parameter value is less than 1.

* * * * *